United States Patent [19]

Eklund et al.

[11] Patent Number: 5,102,809
[45] Date of Patent: Apr. 7, 1992

[54] SOI BICMOS PROCESS

[75] Inventors: Robert H. Eklund, Plano; Ravishankar Sundaresan, Garland, both of Tex.

[73] Assignee: Texas Instruments Incorporated, Dallas, Tex.

[21] Appl. No.: 595,505

[22] Filed: Oct. 11, 1990

[51] Int. Cl.⁵ .................. H01L 21/265; H01L 21/86
[52] U.S. Cl. .......................... 437/21; 437/31; 437/59; 437/84; 357/23.7; 357/43; 148/DIG. 150
[58] Field of Search .............. 437/59, 21, 84; 357/43, 357/23.7; 148/DIG. 150

[56] References Cited

U.S. PATENT DOCUMENTS

| | | |
|---|---|---|
| 4,526,631 | 7/1985 | Silvestri et al. |
| 4,863,878 | 9/1989 | Hite et al. |
| 4,897,703 | 1/1990 | Spratt et al. |
| 4,899,202 | 2/1990 | Blake et al. |
| 4,906,587 | 3/1990 | Blake |

Primary Examiner—Olik Chaudhuri
Assistant Examiner—Long Pham
Attorney, Agent, or Firm—Richard A. Stoltz; Rene E. Grossman; Richard L. Donaldson

[57] ABSTRACT

This invention is an SOI BICMOS process which uses oxygen implanted wafers as the starting substrate. The bipolar transistor is constructed in two stacked epitaxial layers on the surface of the oxygen implanted substrate. A buried collector is formed in the first epitaxial layer that is also used for the CMOS transistors. The buried collector minimizes the collector resistance. Selective epitaxial silicon is then grown over the first epitaxial layer and is used to form the tanks for the bipolar transistors. An oxide layer is formed over the base to serve as an insulator between the emitter poly and the extrinsic base, and also as an etch stop for the emitter etch. The emitter is formed of a polysilicon layer which is deposited through an opening in the oxide layer such that the polysilicon layer contacts the epitaxial layer and overlaps the oxide layer.

7 Claims, 10 Drawing Sheets

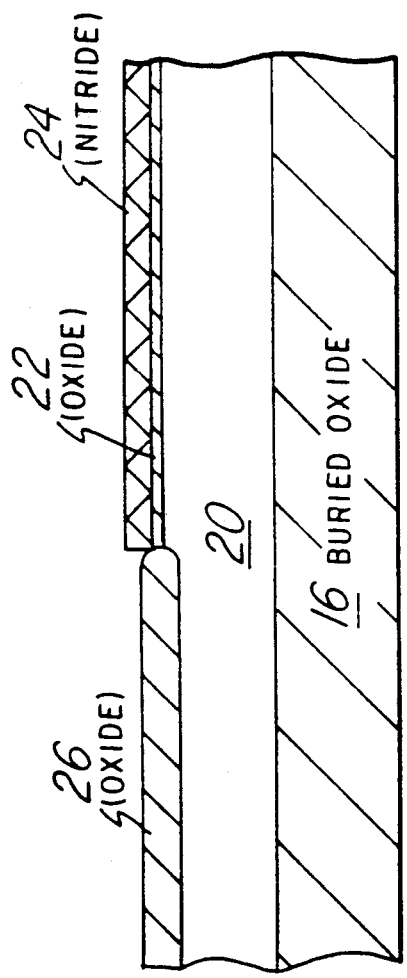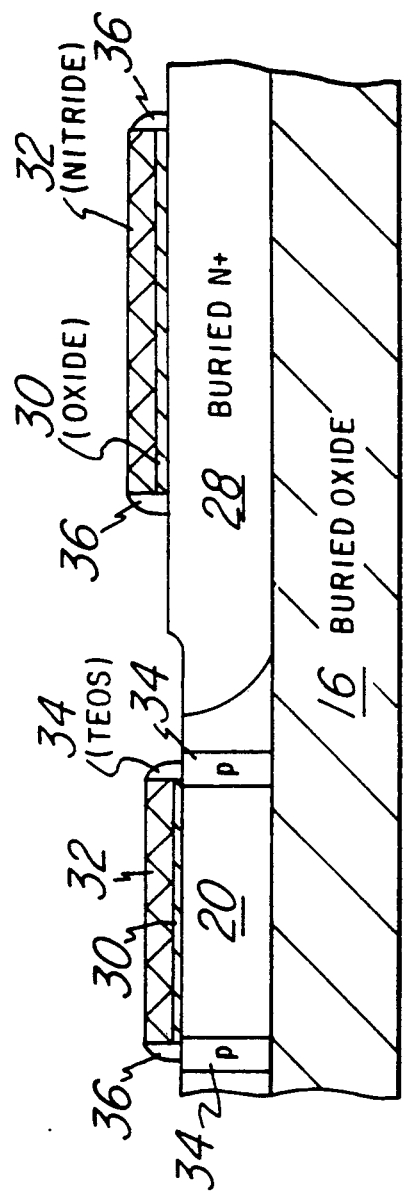

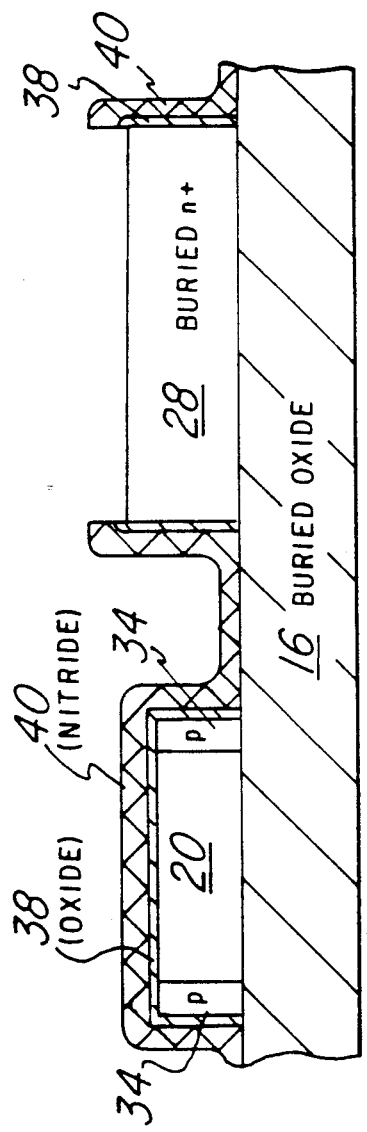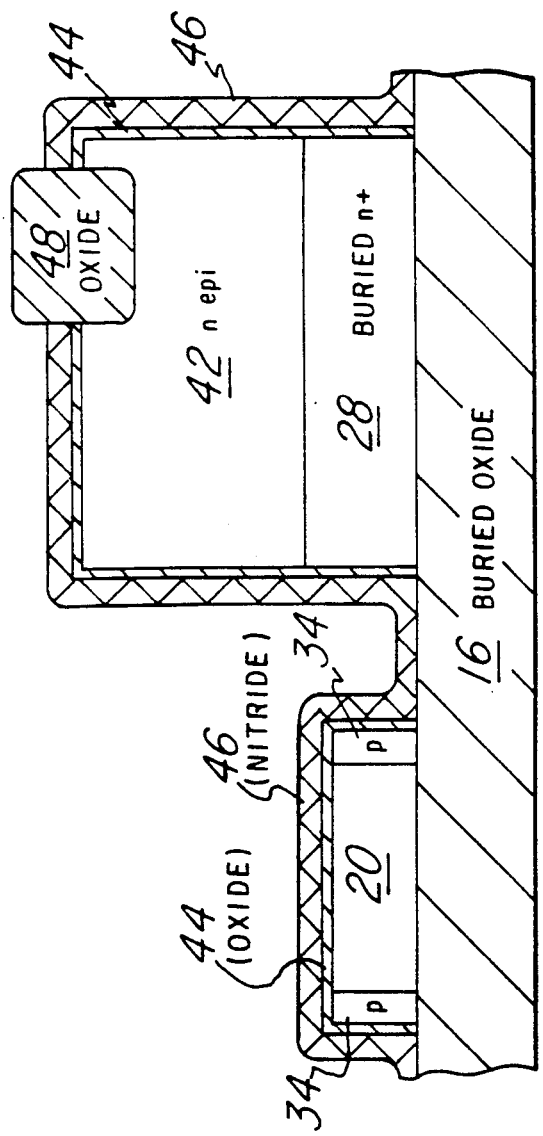

SOI BICMOS PROCESS

This invention was made with Government support under contract No. SC-0010-87-0021 awarded by Naval Weapons Support Center. The Government has certain rights to this invention.

RELATED APPLICATIONS

"BiCMOS/SOI Process Flow", by Robert H. Eklund, (U.S. Pat. No. 5,049,513) and "Self-Aligned Bipolar Transistor Structure and Fabrication Process", by Robert H. Eklund, application Ser. No. 583,422, both assigned to Texas Instruments.

BACKGROUND OF THE INVENTION

This invention is in the field of integrated circuits, and is specifically directed to the process of forming a bipolar transistor structure that is compatible with the formation of CMOS structures on a single semiconductor substrate.

The integration of MOSFET structures and bipolar transistors on a single substrate has become very desirable. In addition, silicon on insulator (SOI) technology offers the highest performance for a given feature size due to the minimization of parasitic capacitance.

As is well known in the art, digital and linear functions are often performed by integrated circuits using either bipolar or metal-oxide-semiconductor (MOS) technology. Bipolar integrated circuits, of course, provide higher speed operation and greater drive currents than the MOS circuits, at the cost of higher power dissipation, especially when compared against complementary MOS (CMOS) circuits. Recent advances in manufacturing technology have allowed the use of both bipolar and CMOS transistors in the same integrated circuit (commonly referred to as BiCMOS devices). Further exploitation of the high current driving capabilities of the bipolar transistor is important to obtaining even higher levels of bipolar or merged bipolar CMOS integration.

To date, SOI processes have been CMOS oriented. For bipolar or BICMOS processes in SOI, typical problems have been the defect density caused by the buried oxide layer. Various approaches to SOI bipolar structures have been demonstrated but these approaches suffer from the limitation that they require trench isolation which, in addition to being an expensive process, trench isolation tends to be a yield limiting process in manufacturing.

SUMMARY OF THE INVENTION

The invention provides a bipolar transistor structure on a buried oxide layer for use in an integrated circuit and a method for fabricating the same. The invention may be incorporated into a method for fabricating bipolar transistors in a BiCMOS structure. The bipolar structure can be integrated into a CMOS/SOI (silicon on insulator) process flow.

This invention is an SOI BICMOS process which uses oxygen implanted wafers as the starting substrate. Although oxygen implanted wafers are used in this description, any SOI substrate can be used. The bipolar transistor is constructed in two stacked epitaxial layers on the surface of the oxygen implanted substrate. A buried collector is formed in the first epitaxial layer that is also used for the CMOS transistors. The buried collector minimizes the collector resistance. Selective epitaxial is then grown over the first epitaxial layer and is used to form the tanks for the bipolar transistors. An oxide layer is formed over the base to serve as an insulator between the emitter poly and the extrinsic base, and also as an etch stop for the emitter polysilicon etch. The emitter is formed of a polysilicon layer which is deposited through an opening in the oxide layer such that the polysilicon layer contacts the epitaxial layer and overlaps the oxide layer.

This is a method of fabricating a bipolar transistor and a CMOS transistor on an SOI substrate, the method comprises: forming a first epitaxial layer on the surface of the oxygen implanted substrate, the epitaxial layer having a bipolar transistor region and a CMOS transistor region; forming a buried collector in the bipolar region of the first epitaxial layer; forming a patterned insulator layer over the first epitaxial layer; growing a selective epitaxial layer over the first epitaxial layer to provide a tank for the bipolar transistor; forming an oxide layer over the selective epitaxial layer; forming an opening in the oxide layer; depositing a polysilicon layer; and patterning an emitter contact in the polysilicon layer on the opening in the oxide layer and overlapping the oxide layer, whereby the oxide layer over the selective epitaxial layer serves as an etch stop for the emitter etch, and whereby the process can use standard SOI CMOS and bulk BICMOS processes and has the advantage of eliminating the isolation problems encountered in a bulk BICMOS process, and whereby the buried n+ collector reduces the collector resistance.

Preferably, a pad oxide is grown over the first epitaxial layer, followed by a nitride layer on the pad oxide layer (e.g. an approximately 350 angstrom pad oxide and an approximately 1,000 angstrom nitride layer), a moat pattern is formed and a silicon etch is performed to isolate device regions, the silicon etch to isolate device regions is performed prior to the selective epitaxial growth, a CMOS transistor is formed in the CMOS transistor region, and wherein the forming an oxide layer over the selective epitaxial layer also forms an oxide layer on the CMOS region and wherein the patterning of the polysilicon layer also patterns a poly gate. Also, preferably the emitter poly overlaps the oxide layer, whereby the oxide serves as an insulator between the emitter poly and the extrinsic base, and also as an etch stop for the emitter etch.

The invention is also a bipolar transistor and a CMOS transistor on an oxygen implanted silicon substrate, where the transistors comprise: a buried oxide substrate; an CMOS epitaxial mesa; a stepped epitaxial bipolar mesa on the substrate, the stepped epitaxial bipolar mesa having a lower buried collector portion at essentially the same height as the CMOS mesa and also having an upper portion; a poly gate on the CMOS mesa; and a poly emitter contact on the bipolar mesa upper portion.

This process can use standard SOI CMOS and bulk BICMOS processes and has the advantage of eliminating the isolation problems encountered in a bulk BICMOS process.

BRIEF DESCRIPTION OF THE DRAWINGS

FIGS. 2 through 11 are cross-sectional views showing the processing steps of a preferred embodiment of the present invention wherein a bipolar transistor is constructed in two epitaxial layers on top of a buried oxide layer, and an NMOS transistor is constructed in a single epitaxial layer on top of the same buried oxide layer.

DETAILED DESCRIPTION OF THE INVENTION

A preferred embodiment of the present invention is described herein as incorporated into a BiCMOS structure. BiCMOS processes can be integrated into a CMOS/SOI process flow. An example of SOI is described in U.S. Pat. No. 4,863,878 issued 9/5/89 to Houston, et al. It should of course be understood that the bipolar transistor according to the invention may be incorporated into integrated circuits which are constructed as bipolar circuits.

This invention uses an SOI process which is suitable for fabricating either bipolar or BICMOS circuits without requiring that trench isolation be used. In addition, this process could be used to fabricate fully isolated NPN and PNP bipolar transistors and resistors. The process requires a selective epitaxial for the bipolar transistor with the rest of the process being a combination of standard SOI CMOS and bulk BICMOS processes.

Figure 1:
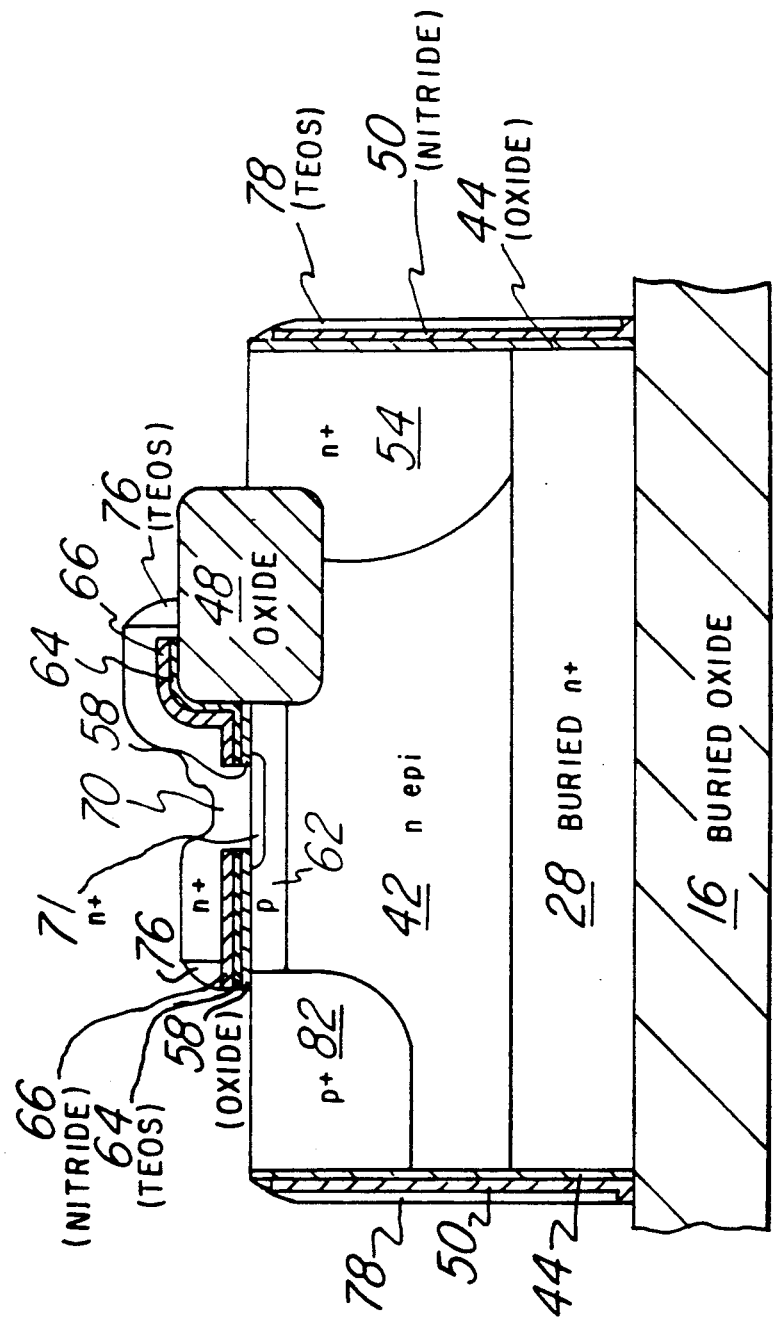
FIG. 1 is a cross-sectional view showing a preferred embodiment of the present invention wherein a bipolar transistor is constructed in two epitaxial layers on top of a buried oxide layer.
Figure 9:
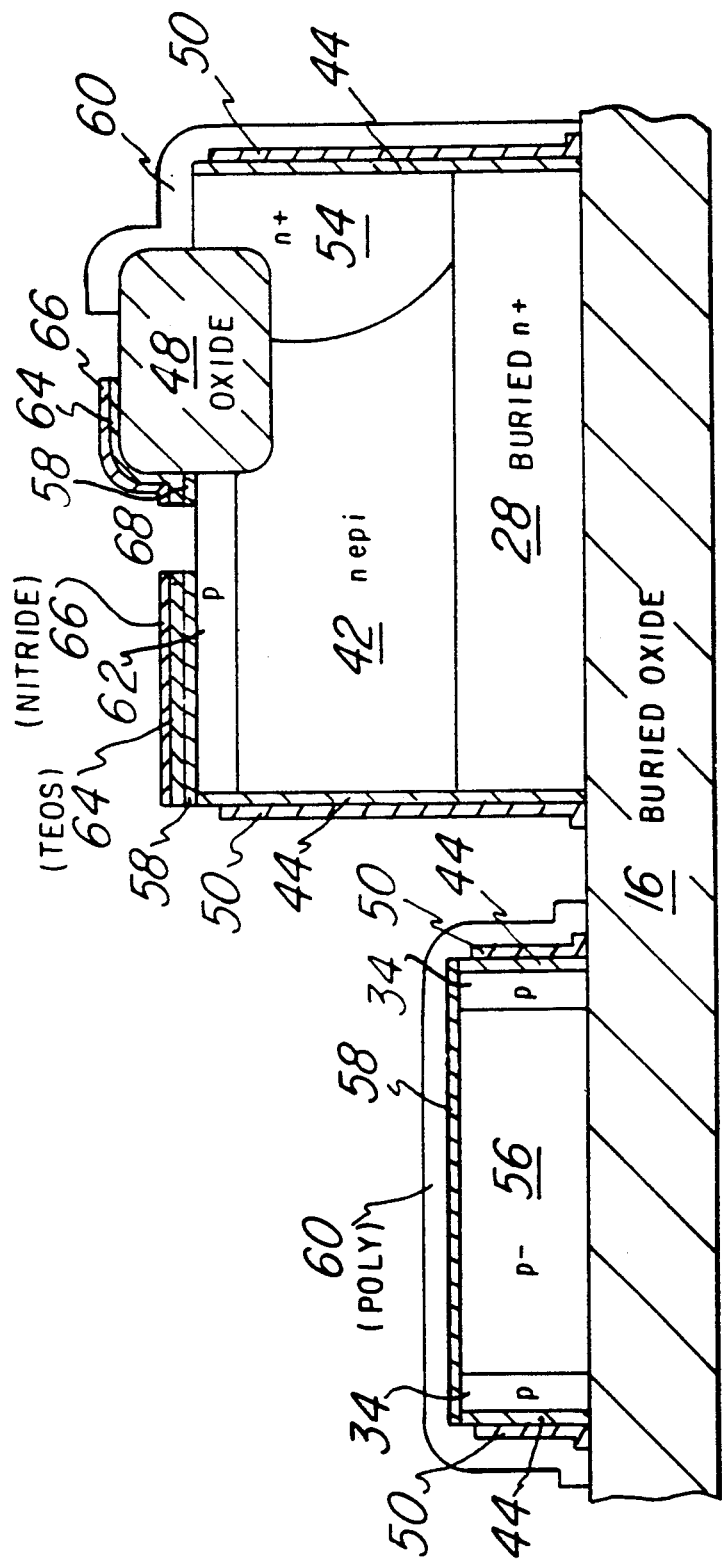
Figure 10:
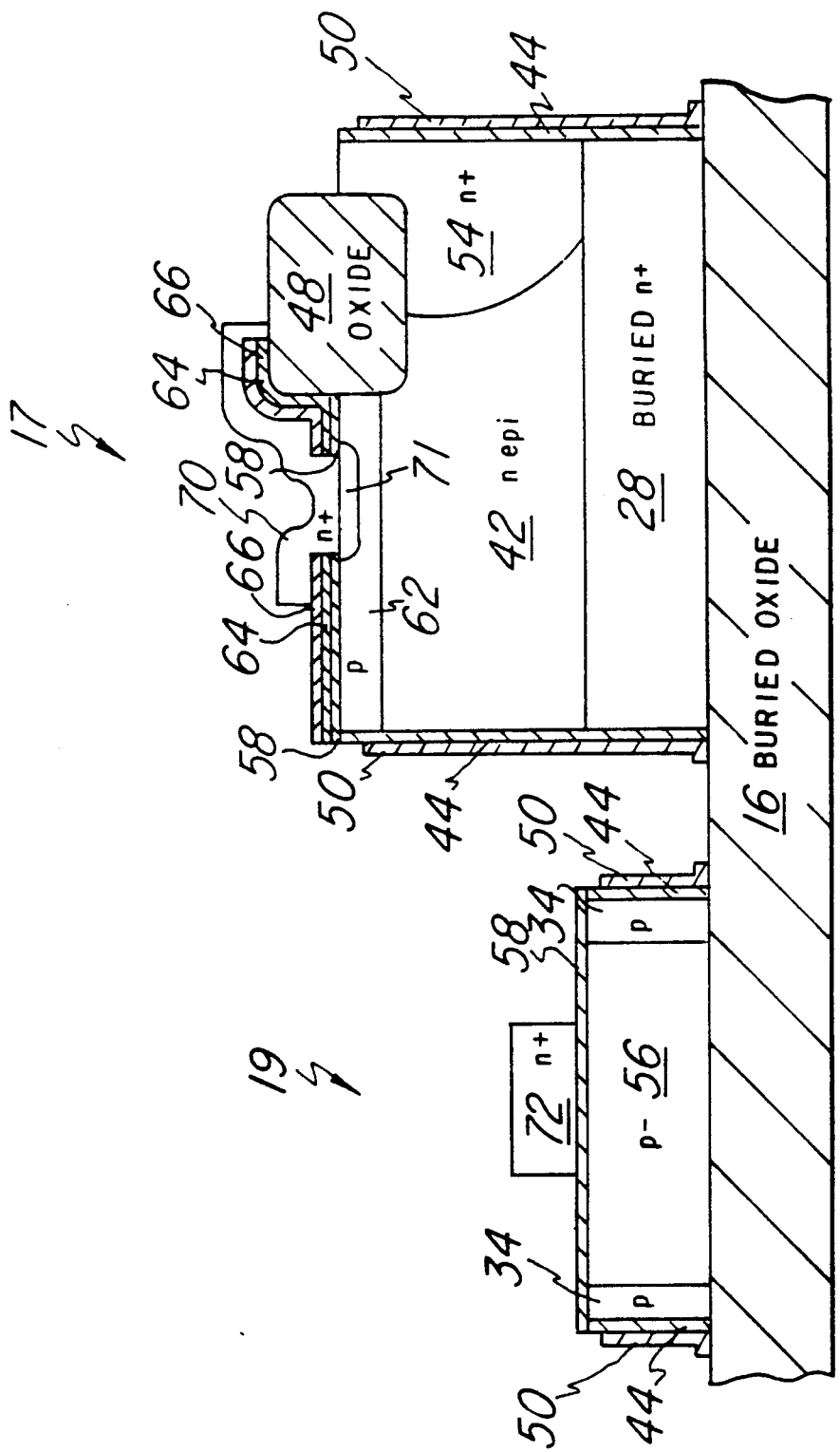
Figure 11:
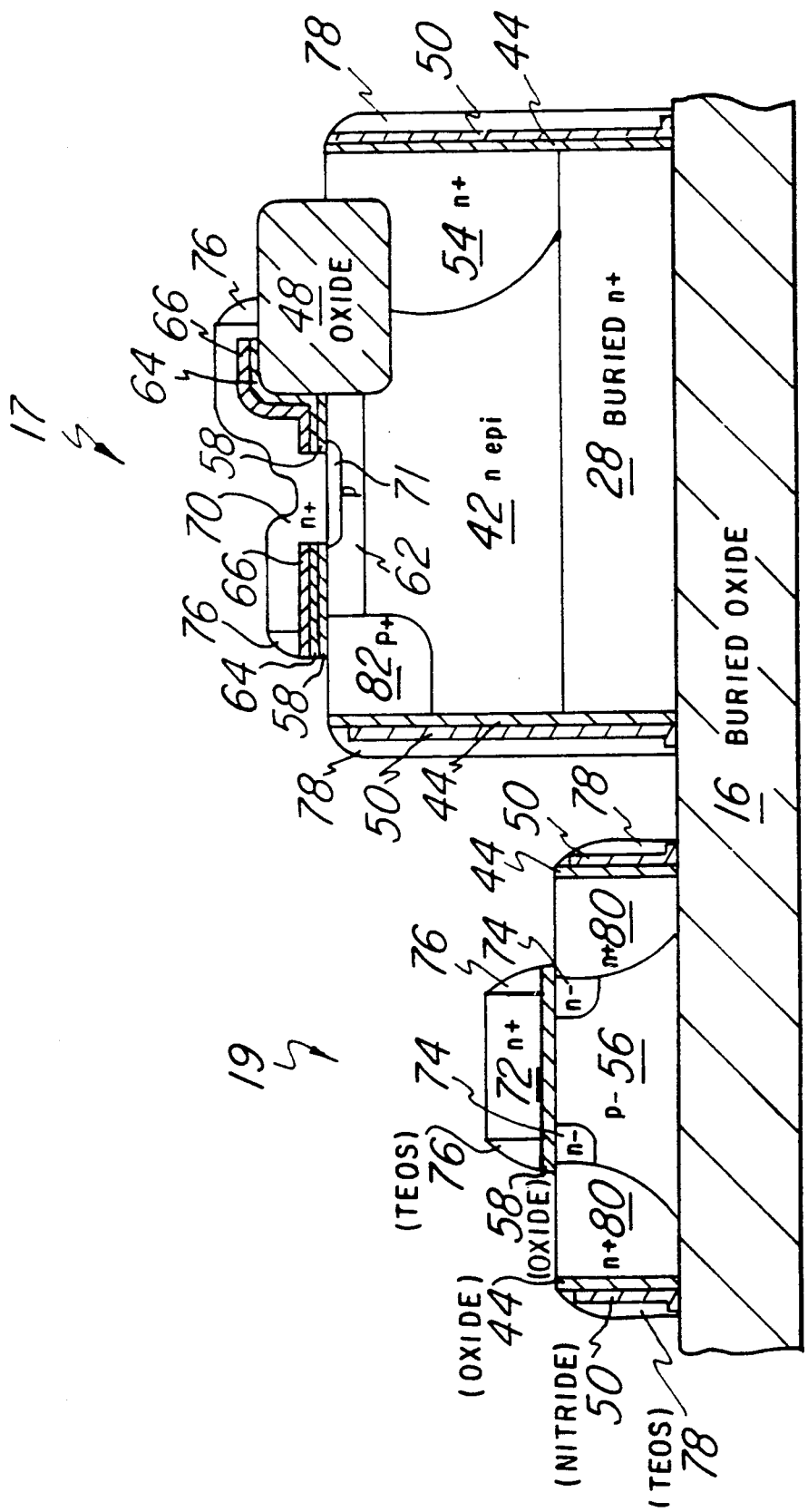

FIGS. 1 through 11 are cross sectional diagrams showing a preferred embodiment of the present invention and method for forming the same. FIG. 1 is a cross-sectional view of the bipolar transistor 17. The buried N+ layer 28 which forms the buried bipolar collector is formed in the same epitaxial layer as the MOSFET, as shown in FIG. 11. The circuit contains buried oxide layer 16, buried n+epitaxial layer 28, n-type intrinsic collector 42 formed in the second epitaxial layer, bipolar thick oxide region 48, oxide sidewalls 44, nitride sidewalls 50, TEOS sidewalls 52, deep n+ extrinsic collector 54, oxide layer 58, p-type intrinsic base 62, TEOS layer 64, nitride layer 66, emitter polysilicon 70, emitter 71, TEOS sidewalls 76 and 78, and p+ extrinsic base 82.

A technical advantage is provided by the buried n+ collector 28 by reducing the collector resistance. The resistance is reduced by the higher doping level of the buried N+ 28. A further technical advantage is the ability to locate the deep n+ extrinsic collector further from the emitter by using a thick oxide 48 without significantly increasing the collector resistance. This lowers the capacitance collector and base.

FIGS. 2 through 11 are cross sectional drawings showing a process flow for integrating a preferred embodiment of the present invention into a CMOS/SOI process flow. Although oxygen implanted wafers are used in this description, any SOI substrate can be used. The process starts out using the standard SOI substrate fabrication technology. The starting material is P<100>. Oxygen is implanted into the starting material followed by a 1275 degree C anneal to form buried oxide layer 16. Multiple implant and anneal cycles will probably be desirable when forming the buried oxide layer 16 in order to minimize the defect density in subsequent epitaxial layers. Then an epitaxial layer 20 is grown over the surface of buried oxide 16. Epitaxial layer 20 has a thickness of approximately 0.6 um. This epitaxial layer 20 is used to form the CMOS transistors and the buried subcollectors for the bipolar transistors. A 350 angstrom pad oxide 22 is grown over epitaxial layer 20, followed by the deposition of a 1,000 angstrom nitride layer 24.

The inverse of the bipolar collector region is patterned and the nitride is etched. An oxide 26, shown in FIG. 2, is grown to reduce the epitaxial thickness to approximately 0.33 um as required by the CMOS transistor design. After stripping the nitride 24 and deglazing the pad oxide 22, the buried n+ region 28 is implanted with ions such as antimony or arsenic, followed by a diffusion (e.g. 1250 degrees C. for 30 minutes for antimony) and annealed. Alternatively, the buried collector 28 could be formed after the moat pattern and silicon etch which form isolated device regions. The first approach is used in this embodiment in order to minimize any etching into the buried oxide layer 16 that would occur with the alternative approach.

If a PNP transistor is needed, this procedure can be repeated to open up silicon islands in which boron can be implanted to form the buried P+ subcollector of a PNP transistor. First, the nitride 24 is stripped (oxide 22 is not etched), then ions such as boron are implanted followed by an anneal.

Next, the oxide layer 26 is removed by a wet deglaze. A pad oxide 30 is grown, followed by a 1,400 angstrom nitride 32. The CMOS mesa 19 and bipolar mesa 17 are then patterned and the oxide/nitride stack is etched. After patterning and implanting ions such as boron (e.g. 0 degrees 1.8E13 cm−2 at 30 KeV and 3.0E13 cm−2 at 80 KeV) to form the NMOS channel stops 34, a 1,000 angstrom TEOS film is deposited, densified, and etched to form a sidewall oxide spacer 36 on the mesa stack, as shown in FIG. 3.

At this point, the silicon etch to form the mesas is performed. Then the TEOS 36, nitride 32, and oxide 30 are stripped. After an oxidation 38 and nitride deposition 40, the bipolar collector 28 is patterned and the oxide layer 38 and nitride layer 40 are etched from the surface of island 17. This leaves a sidewall of nitride 40 and oxide 38 on the bipolar island 17, shown in FIG. 4. Next, a selective n-type epitaxial layer 42 is grown for the bipolar transistor 19. This selective epitaxial layer 42 is grown instead of a blanket epitaxial layer as has been proposed in U.S. Pat. No. 5,049,513. The thickness of epitaxial layer 42 is on the order of 1 um. While the epitaxial layer 42 could be grown as intrinsic and implant doped, it is grown n-type in this embodiment. Then nitride layer 40 and oxide layer 38 are stripped.

Next, a 350 angstrom pad oxide 44 is grown, followed by a 1,400 angstrom nitride 46. Then the oxide/nitride layer is patterned and etched, and a 7000 angstrom bipolar thick oxide 48 is grown, as shown in FIG. 5. The bipolar thick oxide 48 is grown in a high pressure mode to minimize the thermal cycle. This bipolar thick oxide 48 serves as a self aligning mask between the deep n+ collector 54 and base 62. While the bipolar field oxide 48 is only shown between the base 62 and deep n+ regions 54, it could surround the base and deep n+ moats if necessary.

Figure 6:
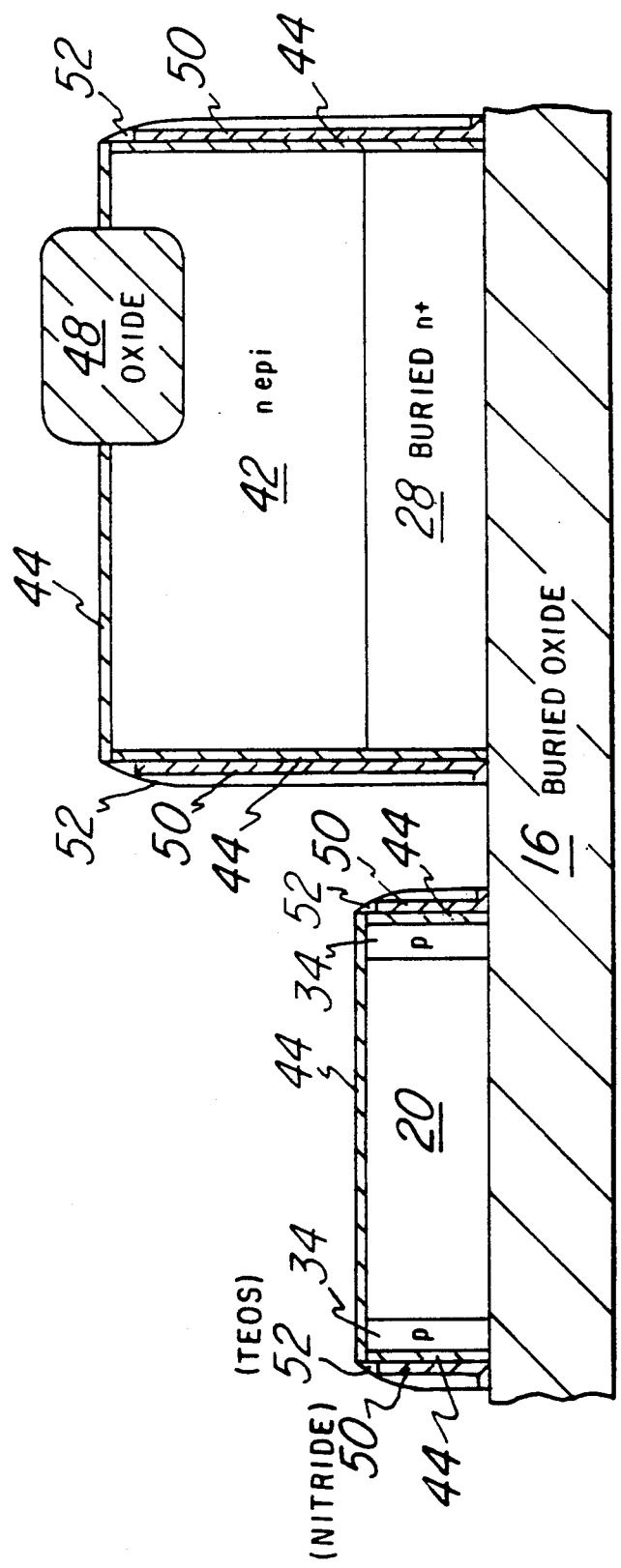
Figure 7:
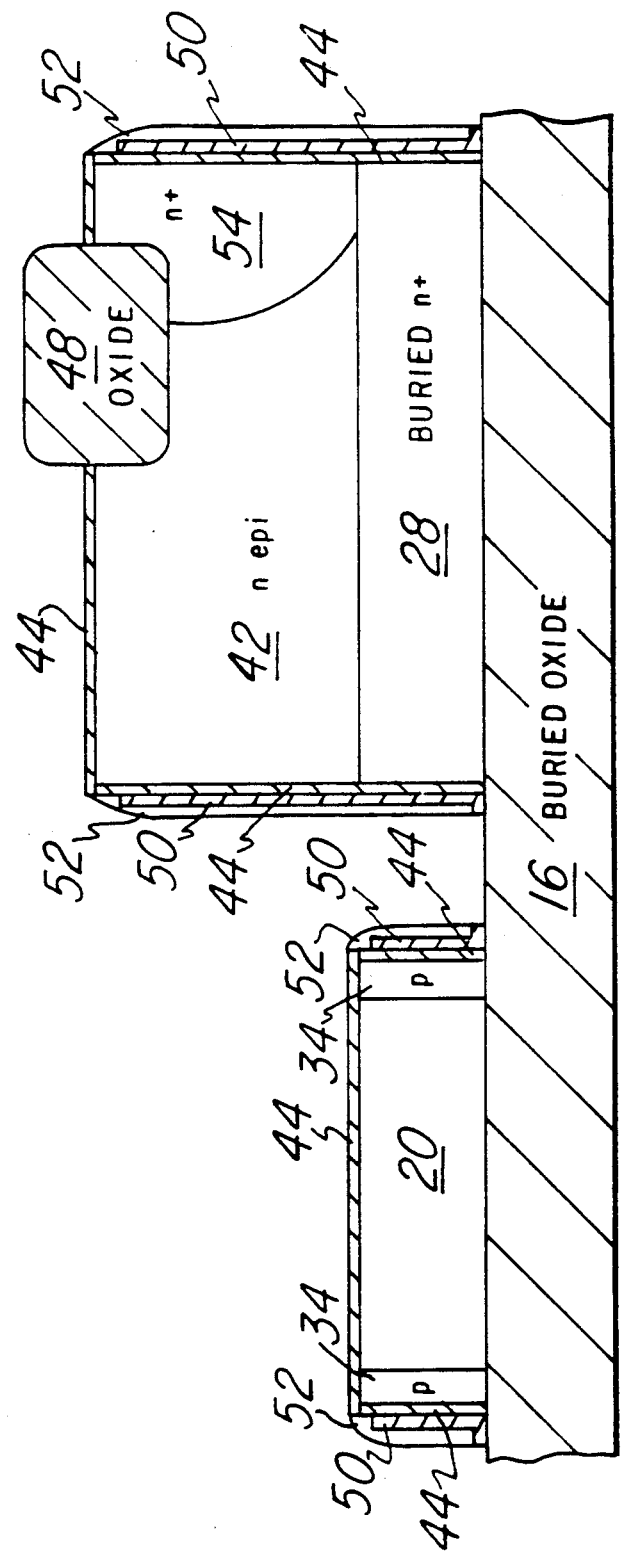

After a nitride strip, the sidewall formation is completed by means of a 150 angstrom nitride deposition 50 followed by a 1,000 angstrom TEOS deposition 52 and plasma etch to form the sidewalls 52 shown in FIG. 6. The deep n+ collector 54 is patterned and implanted with ions such as phosphorus (e.g. 1.0E16 cm−2 at 150 KeV), and is self aligned to the bipolar thick oxide 48, as shown in FIG. 7. The NMOS and PMOS threshold voltage, and tank implants are then patterned and implanted with ions such as boron (e.g. 1.7E12 cm−2 at 25KeV and 3.5E12 cm−2 at 80 KeV) for the NMOS threshold voltage and tank 56, and boron (e.g. 1.0E12 cm−2 at 24 L KeV) and phosphorus (e.g. 2.7E12 cm−2 at 180 KeV) for the PMOS threshold voltage and tank (not shown).

Figure 8:
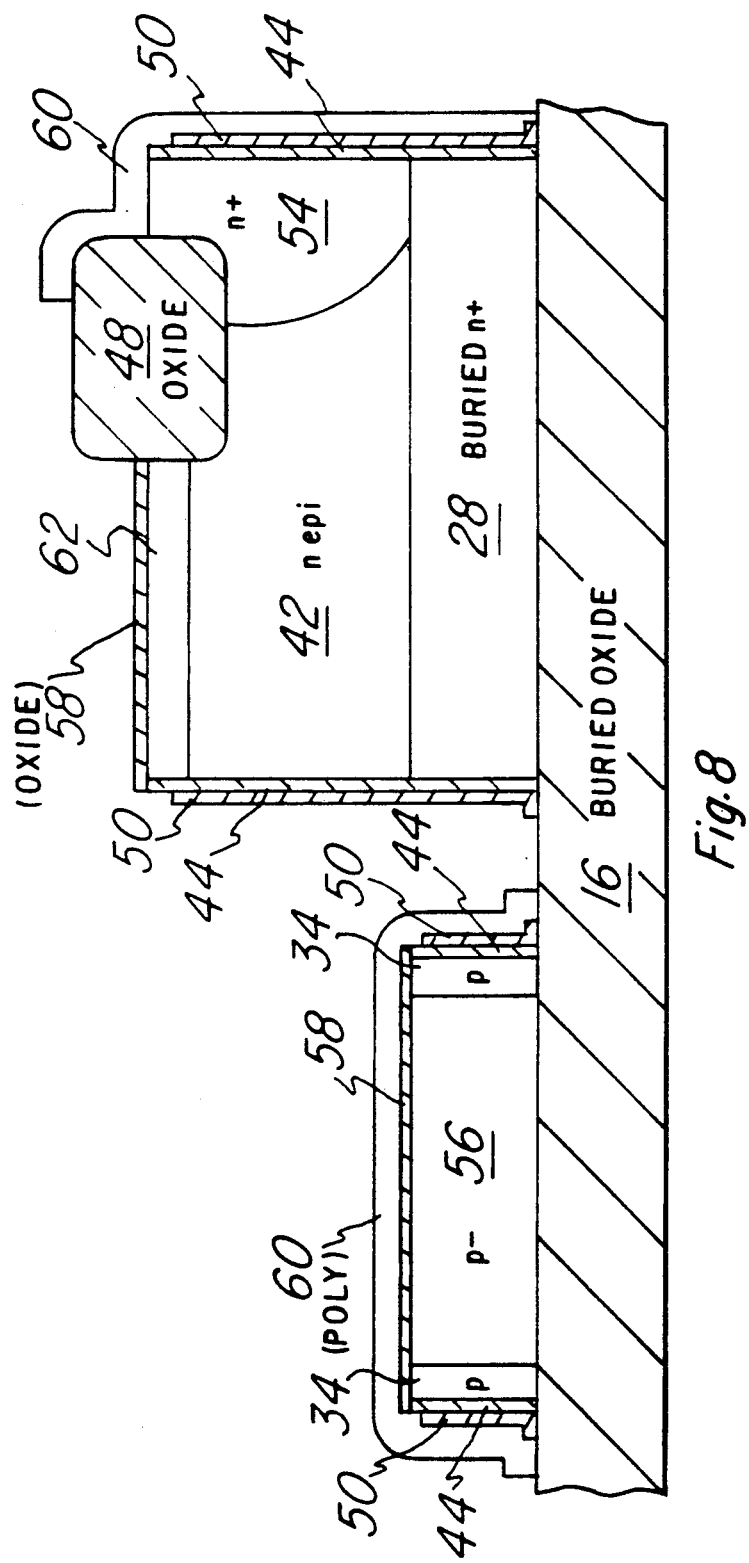

After deglazing the dummy oxide 44 from the mesa surface, a 200 angstrom gate oxide 58 is grown, followed by a 2,000 angstrom polysilicon deposition 60. It should be mentioned that a split polysilicon process is being used so that the MOS gate oxide 58 can be protected while the bipolar base 62 and emitter window 68 are being formed. The bipolar base region 62 is patterned and the polysilicon is removed from this region by a plasma etch. The p-type intrinsic base 62 is then formed by implanting ions such as boron, as shown in FIG. 8. The intrinsic base 62 is formed following gate oxidation to limit its junction depth. Next, a 600 angstrom TEOS layer 64 is deposited, followed by a 200 angstrom nitride layer 66. The TEOS layer 64 and nitride layer 66 are used to increase dielectric thickness between emitter poly 70 and extrinsic base 78 (although not shown on the figures, these layers can be masked to slightly overlap the extrinsic base side of the mesa to make alignment less critical). The dielectric thickness is increased to reduce the capacitance between emitter poly 70 and extrinsic base 78. Other methods could be used to increase the dielectric thickness such as a TEOS layer only or a nitride layer only. The emitter contact is patterned so that it opens the emitter window 68 and all CMOS regions but leaves the TEOS/nitride stack 64 and 66 over the rest of the bipolar base region, as shown in FIG. 9. The first 2,000 angstrom polysilicon film 60 protects the CMOS regions from the emitter etch. This process has been used for bulk BiCMOS without any GOI (gate oxide integrity) degradation problems.

Next, after a short deglaze, a 2,500 angstrom polysilicon layer is deposited and doped by implantation of ions such as arsenic (e.g. 5E15 cm−2 at 50 KeV and 5E15 cm−2 at 150 KeV) and phosphorus (e.g. 2E15 cm−2 at 80KeV). This forms the emitter 71. This polysilicon layer serves as the bipolar emitter contact 70 and, in combination with the first polysilicon layer, forms a 4,500 angstrom polysilicon gate 72. Next, the gates and emitters are patterned and the polysilicon is etched, as shown in FIG. 10. After patterning and implanting both p (e.g. boron, 1.0E13 cm−2 at 20 KeV, 0 degrees) and n− 74 (e.g. phosphorus, 8.OE13 cm−2 at 80 KeV, 0 degrees) LDDs (lightly doped drains), a 2,500 angstrom TEOS layer is deposited and etched back to form sidewall oxide spacers 76 and 78. Then a 300 angstrom TEOS screen oxide (not shown) is deposited. Next, the p+ (not shown) and n+80 source/drain (S/D) regions are patterned and implanted. For the p+ S/D regions, ions such as boron (e.g. 3.0E15 cm−2 at 20KeV, 0 degrees) are implanted. For the n+ S/D regions 80, ions such as arsenic (e.g. 3.0E15 cm−2 at 150KeV, 0 degrees) and phosphorus (e.g. 5.0E14 cm−2 at 120KeV, 0 degrees) are implanted. The p+ S/D implant also forms the extrinsic base 82. Next, an S/D anneal is performed at 900 degrees C. for 25 minutes. The TEOS is then plasma etched to leave the TEOS sidewalls 76 and 78.

FIG. 11 shows the cross section after the S/D anneal cycle has been completed and the screen oxide has been etched. Titanium disilicide is then used to simultaneously clad all diffusions and gates. Standard multilevel metal processing completes the process flow.

Figure 12:
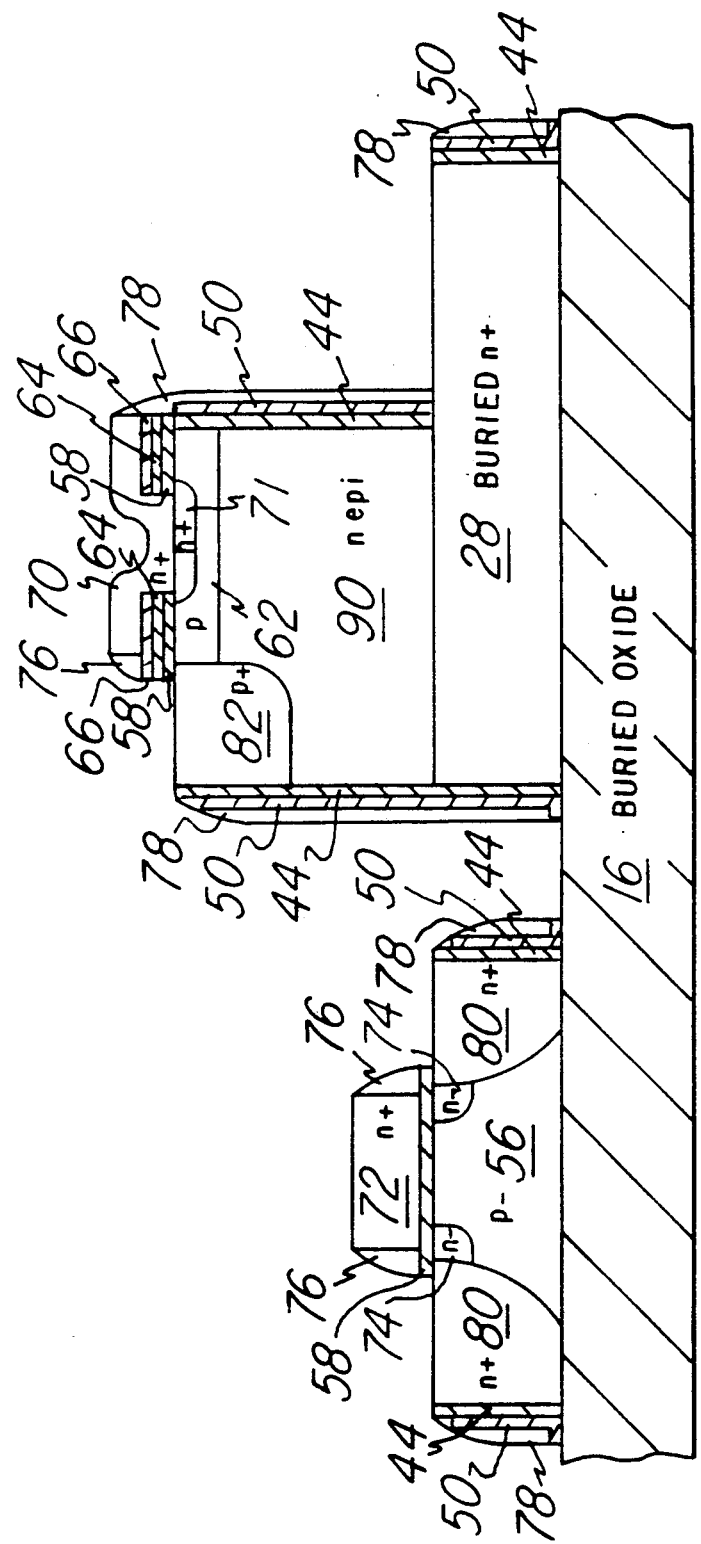
FIG. 12 is a cross-sectional view showing an alternative preferred embodiment of the present invention wherein a bipolar transistor with a recessed collector contact is constructed in two epitaxial layers on top of a buried oxide layer, and an NMOS transistor is constructed in a single epitaxial layer on top of the same buried oxide layer.

An alternative embodiment of the present invention is shown in FIG. 12. Like numbers refer to like parts where possible. In FIG. 12, the selective epitaxial layer 90 is grown over only a portion of the buried collector 28. A metal contact is dropped down to the buried collector 28 for the collector contact. This alternative embodiment provides the benefit of further reducing the collector resistance by connecting the metal contact directly to the buried collector 28 as compared to using the deep n+ extrinsic collector 54 in the first preferred embodiment above.

Although specific embodiments of the present invention are herein described, they are not to be construed as limiting the scope of the present invention. For example, the NPN bipolar transistor shown in the preferred embodiment could be built as a PNP bipolar transistor by switching the dopants around. The PNP would contain a buried p+ layer, n-type base, p-type epitaxial layer, and p+ emitter. The emitter implant would have to be patterned. Also, the preferred embodiment is described for a BiCMOS/SIMOX process, but the invention could be used for a bipolar/SIMOX process also. Many embodiments of the present invention will become clear to those skilled in the art in light of the teachings of the specification. The scope of the invention is limited only by the claims appended.

I claim:

1. A method of fabricating a bipolar transistor and a CMOS transistor on an SOI substrate, said method comprising:
    a. forming a first epitaxial layer on the surface of the oxygen implanted substrate, said epitaxial layer having a bipolar transistor region and a CMOS transistor region;
    b. forming a buried collector in said bipolar region of said first epitaxial layer;
    c. forming a patterned insulator layer over said first epitaxial layer, said patterned insulator having an opening in said bipolar transistor region;
    d. growing a selective epitaxial layer in said opening of said patterned insulator over the first epitaxial layer;
    e. forming an oxide layer over a top surface of said selective epitaxial layer;
    f. forming an opening in the oxide layer;
    g. depositing a polysilicon layer in said opening of said oxide layer; and
    h. patterning an emitter contact in said polysilicon layer on said opening in the oxide layer and overlapping said oxide layer, whereby the oxide layer over said selective epitaxial layer serves as an etch stop for the patterning of said emitter contact and whereby the process can use standard SOI CMOS and bulk BICMOS processes and has the advantage of eliminating the isolation problems encountered in a bulk BICMOS process, and whereby the buried n+ collector reduces the collector resistance.

2. The method of claim 1, wherein said insulating layer is a pad oxide grown over said first epitaxial layer nitride layer on said pad oxide layer.

3. The method of claim 2, wherein a pad oxide and a nitride layer are utilized.

4. The method of claim 1, wherein a moat pattern is formed and a silicon etch is performed to isolate device regions.

5. The method of claim 4, wherein said silicon etch to isolate device regions is performed prior to said selective epitaxial growth.

6. The method of claim 1, wherein a CMOS transistor is formed in said CMOS transistor region, and wherein said forming an oxide layer over said selective epitaxial layer also forms an oxide layer on said CMOS region and wherein said patterning of said polysilicon layer also patterns a poly gate.

7. The method of claim 1, wherein said emitter poly overlaps said oxide layer, whereby said oxide serves as an insulator between the emitter poly and the extrinsic base, and also as an etch stop for the emitter etch.

5. The method of claim 4, wherein said silicon etch to isolate device regions is performed prior to said selective epitaxial growth 6. The method of claim 1, wherein a CMOS transistor is formed in said CMOS transistor region, and wherein said forming an oxide layer over said selective epitaxial layer also forms an oxide layer on said CMOS region and wherein said patterning of said polysilicon layer also patterns a poly gate.

7. The method of claim 1, wherein said emitter poly overlaps said oxide layer, whereby said oxide serves as an insulator between the emitter poly and the extrinsic base, and also as an etch stop for the emitter etch.

* * * * *